United States Patent
Chen et al.

(10) Patent No.: US 9,391,028 B1
(45) Date of Patent: Jul. 12, 2016

(54) INTEGRATED CIRCUIT DIES HAVING ALIGNMENT MARKS AND METHODS OF FORMING SAME

(71) Applicant: Taiwan Semiconductor Manufacturing Company, Ltd., Hsin-Chu (TW)

(72) Inventors: Hsien-Wei Chen, Hsin-Chu (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/815,603

(22) Filed: Jul. 31, 2015

(51) Int. Cl.
| | |
|---|---|
| *H01L 21/00* | (2006.01) |
| *H01L 23/544* | (2006.01) |
| *H01L 21/78* | (2006.01) |
| *H01L 21/02* | (2006.01) |
| *H01L 21/302* | (2006.01) |
| *H01L 23/00* | (2006.01) |
| *H01L 23/31* | (2006.01) |

(52) U.S. Cl.
CPC ........ *H01L 23/544* (2013.01); *H01L 21/02008* (2013.01); *H01L 21/302* (2013.01); *H01L 21/78* (2013.01); *H01L 23/3114* (2013.01); *H01L 24/09* (2013.01); *H01L 24/89* (2013.01); *H01L 2223/54426* (2013.01); *H01L 2223/54453* (2013.01); *H01L 2224/0237* (2013.01); *H01L 2224/08238* (2013.01)

(58) Field of Classification Search
CPC . H01L 21/78; H01L 21/02008; H01L 21/302; H01L 23/544; H01L 23/3114; H01L 24/89; H01L 2223/54426; H01L 2223/54453; H01L 2224/0237; H01L 2224/08238
USPC ......... 438/462, 975, 455, 458–460, 107, 108, 438/110; 257/620, 797, E23.179
See application file for complete search history.

(56) References Cited

U.S. PATENT DOCUMENTS

| | | | |
|---|---|---|---|
| 8,361,842 B2 | 1/2013 | Yu et al. | |
| 8,629,568 B2 | 1/2014 | Lin et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2004/0113283 A1* | 6/2004 | Farnworth .......... | H01L 21/3043 257/782 |
| 2008/0296716 A1* | 12/2008 | Chan ...................... | H01L 21/56 257/433 |
| 2009/0121321 A1* | 5/2009 | Miccoli ............... | G03F 7/70625 257/618 |
| 2011/0291288 A1 | 12/2011 | Wu et al. | |
| 2013/0026468 A1 | 1/2013 | Yoshimuta et al. | |
| 2013/0026643 A1* | 1/2013 | England ................ | H01L 21/561 357/774 |
| 2013/0062760 A1 | 3/2013 | Hung et al. | |
| 2013/0062761 A1 | 3/2013 | Lin et al. | |
| 2013/0168848 A1 | 7/2013 | Lin et al. | |

(Continued)

*Primary Examiner* — Jasmine Clark
(74) *Attorney, Agent, or Firm* — Slater Matsil, LLP

(57) ABSTRACT

Dies having alignment marks and methods of forming the same are provided. A method includes forming trenches on a first side of a first workpiece, a die of the first workpiece being interposed between neighboring trenches. A portion of the die is removed to form an alignment mark, the alignment mark extending through an entire thickness of the die. A second side of the first workpiece is thinned until the die is singulated, the second side being opposite the first side.

20 Claims, 9 Drawing Sheets

(56) References Cited

U.S. PATENT DOCUMENTS

| | | |
|---|---|---|
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

* cited by examiner

INTEGRATED CIRCUIT DIES HAVING ALIGNMENT MARKS AND METHODS OF FORMING SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
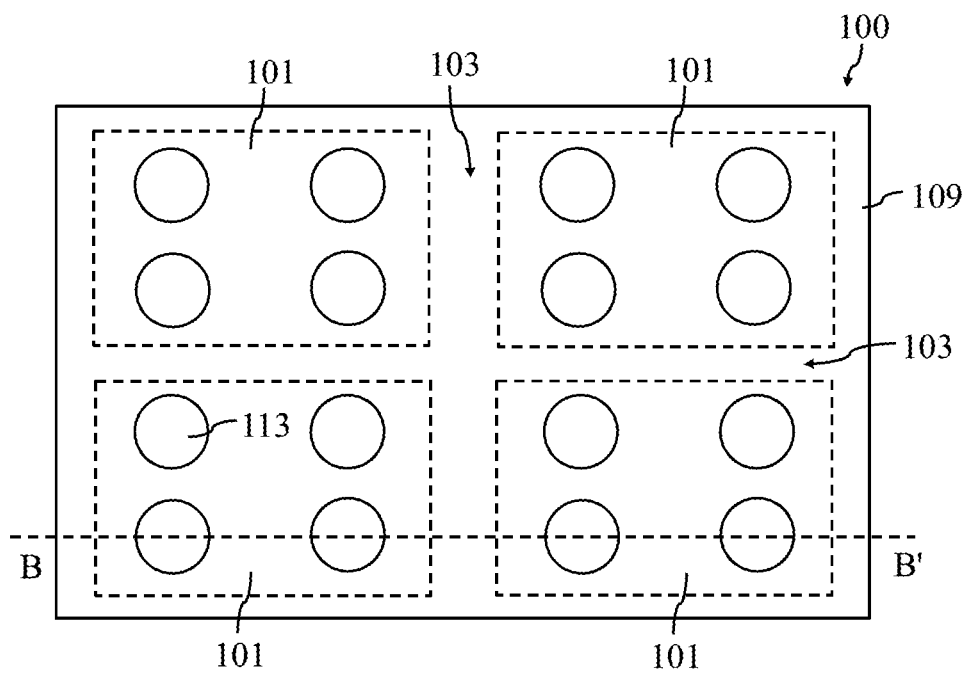
FIGS. 1A-3B are top and cross-sectional views of various processing steps during fabrication of integrated circuit dies having one or more alignment marks in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the disclosed embodiments will be addressed generally. Described below are various integrated circuit dies having alignment marks and methods for forming such integrated circuit dies. In addition, methods of forming integrated circuit packages using integrated circuit dies are described below. By forming integrated circuit dies having one or more alignment marks, undesired shift or rotation of integrated circuit dies may be reduced or avoided while forming integrated circuit packages. Moreover, damage to integrated circuit dies caused by misalignment may be reduced or avoided.

FIGS. 1A-3B are top and cross-sectional views of various processing steps during fabrication of integrated circuit dies having alignment marks in accordance with some embodiments, wherein an "A" figure represents a top view and a "B" figure represents a cross-sectional view along the B-B' line of the respective "A" figure.

Figure 1B:
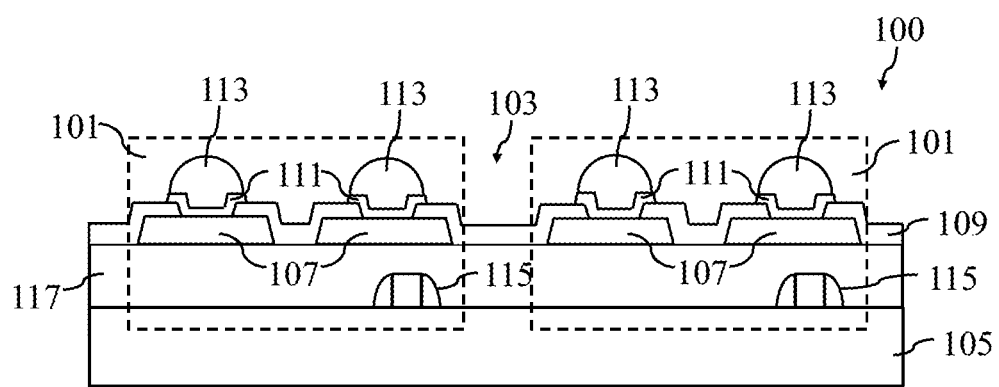

Referring to FIGS. 1A and 1B, a portion of a workpiece 100 having die regions 101 separated by scribe lines 103 (also referred to as dicing lines or dicing streets) is illustrated. As described below in greater detail, the workpiece 100 will be diced along the scribe lines 103 to form individual integrated circuit dies (such as integrated circuit dies 301 illustrated in FIGS. 3A and 3B). In some embodiments, the workpiece 100 comprises a substrate 105, one or more active and/or passive devices 115 on the substrate 105, and one or more metallization layers 117 over the substrate 105 and the one or more active and/or passive devices 115. In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In other embodiments, the substrate 105 may comprise a dielectric material such as silicon oxide, aluminum oxide, the like, or a combination thereof.

In some embodiments, the one or more active and/or passive devices 115 may include various n-type metal-oxide semiconductor (NMOS) and/or p-type metal-oxide semiconductor (PMOS) devices such as transistors, capacitors, resistors, diodes, photo-diodes, fuses and/or the like. In some embodiments, the integrated circuit dies (see FIGS. 3A and 3B) may be discrete semiconductor device chips (sometimes referred to as surface mount devices (SMDs) or integrated passive devices (IPDs)). In such embodiments, the substrate 105 may include various devices such as RLC circuits, capacitors, inductors, transformers, baluns, micro-stripes, co-planar waveguides, or the like, and may be substantially free of active devices.

The one or more metallization layers 117 may include an inter-layer dielectric (ILD)/inter-metal dielectric layers (IMDs) formed over the substrate 105. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), the like, or a combination thereof. In some embodiments, interconnect structures may be formed in the ILD/IMDs using, for example, a damascene process, a dual damascene process, or the like. In some embodiments, interconnect structures may comprise copper, a copper alloy, silver, gold, tungsten, tantalum, aluminum, or the like. In some embodiments, the interconnect structures may provide electrical connections between the one or more active and/or passive devices 115 formed on the substrate 105.

In some embodiments, the workpiece 100 further includes contact pads 107 formed over the one or more metallization layers 117 and may be electrically coupled to the one or more active and/or passive devices 115 through various interconnect structures of the one or more metallization layers 117. As described below in greater detail, connectors will be formed on the contact pads 107. In some embodiments, the contact pads 107 may comprise a conductive material such as aluminum, copper, tungsten, silver, gold, the like, or a combination thereof. In some embodiments, a conductive material may be formed over the one or more metallization layers 117 using, for example, physical vapor deposition (PVD), atomic layer deposition (ALD), electro-chemical plating, electroless plating, the like, or a combination thereof. Subsequently, the conductive material is patterned to form the contact pads 107. In some embodiments, the conductive material may be patterned using photolithography techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 107 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 107. In some embodiments wherein the conductive material is aluminum, the conductive material may be etched using a mixture of 80% phosphoric acid, 5% nitric acid, 5% acetic acid, and 10% de-ionized (DI) water. Subsequently, the photoresist material may be removed using, for example, an ashing process followed by a wet clean process.

Referring further to FIGS. 1A and 1B, in some embodiments, a passivation layer 109 is formed over the substrate 105 and the contact pads 107. In some embodiments, the passivation layer 109 may comprise one or more layers of photo-patternable dielectric materials such as polybenzoxazole (PBO), polyimide (PI), benzocyclobutene (BCB), or the like, and may be formed using a spin-on coating process, or the like. Such photo-patternable dielectric materials may be easily patterned using similar photolithography methods as a photoresist material. In other embodiments, the passivation layer 109 may comprise one or more layers of non-photo-patternable dielectric materials such as silicon nitride, silicon oxide, phosphosilicate glass (PSG), borosilicate glass (BSG), boron-doped phosphosilicate glass (BPSG), or the like, and may be formed using CVD, PVD, ALD, a spin-on coating process, the like, or a combination thereof.

Openings are formed in the passivation layer 109 to expose the contact pads 107. In some embodiments wherein the passivation layer 109 is formed of a photo-patternable dielectric material, the passivation layer 109 may be patterned using similar photolithography methods as a photoresist material. In other embodiments wherein the passivation layer 109 is formed of a non-photo-patternable dielectric material, a photoresist material (not shown) is formed over the passivation layer 109. The photoresist material is subsequently irradiated (exposed) and developed to remove a portion of the photoresist material. Subsequently, exposed portions of the passivation layer 109 are removed using, for example, a suitable etching process to form the openings. In some embodiments wherein the passivation layer 109 is formed of silicon oxide, the passivation layer 109 is etched using, for example, buffered hydrofluoric acid (HF). In some embodiments wherein the passivation layer 109 is formed of silicon nitride, the passivation layer 109 is etched using, for example, hot phosphoric acid ($H_3PO_4$). Subsequently, the photoresist material may be removed using, for example, an ashing process followed by a wet clean process.

In some embodiments, underbump metallizations (UBMs) 111 are formed in the openings of the passivation layer 109 over the exposed contact pads 107. The UBMs 111 may extend through the openings of the passivation layer 109 and may also extend along a surface of the passivation layer 109. In some embodiments, the UBMs 111 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 111. Any suitable materials or layers of materials that may be used for the UBMs 111 are fully intended to be included within the scope of the current application.

In some embodiments, connectors 113 are formed over and are electrically coupled to the UBMs 111. In some embodiments, the connectors 113 may be solder balls, metal pillars, controlled collapse chip connection (C4) bumps, ball grid array (BGA) balls, micro bumps, electroless nickel-electroless palladium-immersion gold technique (ENEPIG) formed bumps, or the like. The connectors 113 may include a conductive material such as solder, copper, aluminum, gold, nickel, silver, palladium, tin, the like, or a combination thereof. In some embodiments in which the connectors 113 are solder bumps, the connectors 113 may be formed by initially forming a layer of solder through commonly used methods such as evaporation, electroplating, printing, solder transfer, ball placement, or the like. Once the layer of solder has been formed on the structure, a reflow may be performed in order to shape the material into the desired bump shapes. In other embodiments, the connectors 113 may be metal pillars (such as, for example, copper pillars) formed by a sputtering, printing, electro-chemical plating, electroless plating, PVD, or the like. The metal pillars may be solder free and have substantially vertical sidewalls. In some embodiments, a metal cap layer (not shown) is formed on the top of the metal pillars. The metal cap layer may include a solder, nickel, tin, tin-lead, gold, silver, palladium, indium, nickel-palladium-gold, nickel-gold, the like, or a combination thereof and may be formed by a plating process, or the like.

Figure 2A:
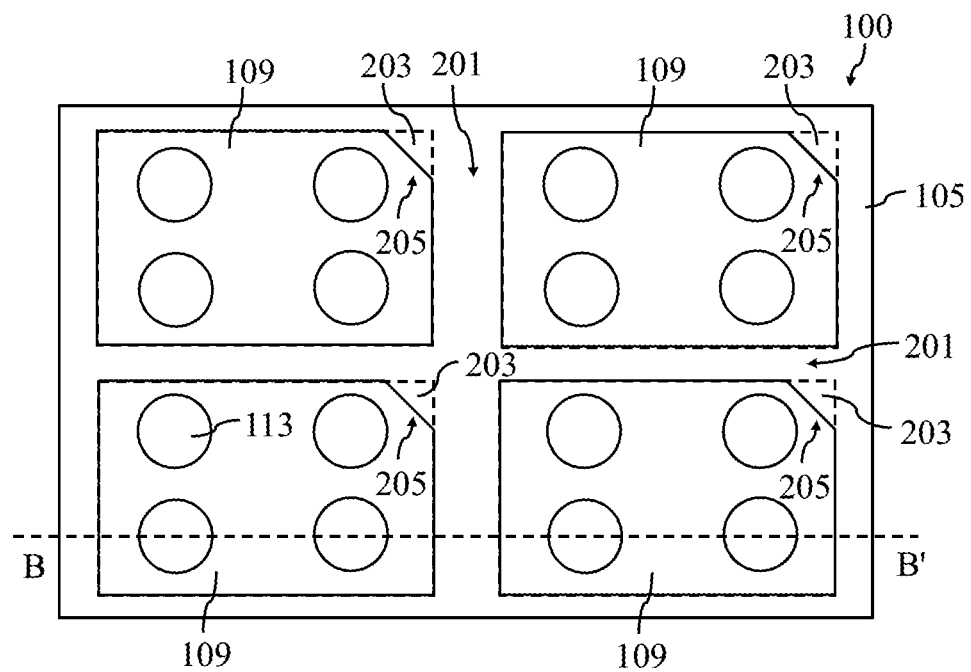
Figure 2B:
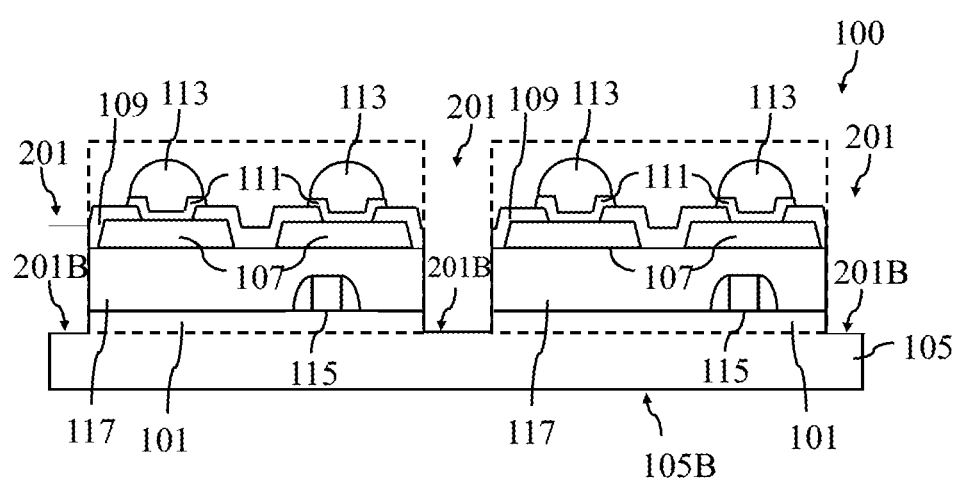

Referring to FIGS. 2A and 2B, in some embodiments, top views of the die regions 101 and, consequently, top views of integrated circuit dies may be geometrically symmetrical under 90°, 180°, and/or 270° rotations. However, the die regions 101 and, consequently, integrated circuit dies may not be functionally symmetrical under 90°, 180°, and/or 270° rotations. Accordingly, one or more alignment marks may be formed on each integrated circuit die to identify a proper orientation of integrated circuit dies. In some embodiments, the workpiece 100 is patterned to form trenches 201 along the scribe lines 103 (see FIGS. 1A and 1B) such that the trenches 201 separate the die regions 101 of the workpiece 100. The trenches 201 have bottoms 201B in the substrate 105 and, therefore, partially dice the workpiece 100 into individual integrated circuit dies. In some embodiments, the patterning process also removes a triangular portion 203 (as viewed from top) from a corner of each of the die regions 101 to form an alignment mark 205 such that bottoms of recesses formed after removing the triangular portions 203 are substantially coplanar with the bottoms 201B of the trenches 201. In some embodiments, each of the alignment marks 205 allows for identification of a proper orientation of a corresponding integrated circuit die. In some embodiments, the workpiece 100 may be patterned using, for example, etching, sawing, laser ablation, the like, or a combination thereof. In some embodiments, suitable etching processes may include a deep reactive-ion etching (DRIE) process such as, for example, the Bosch process, or the like. In some embodiments, the Bosch process may be performed for a period between about 10 sec and about 600 sec, at a temperature between about the room temperature and about 100° C., at a pressure between about a few mTorr and about several hundred mTorr, using an etch gas such as $SF_6/Ar$, or the like, and using a source gas such as $C_4F_8$, or the like.

Figure 3A:
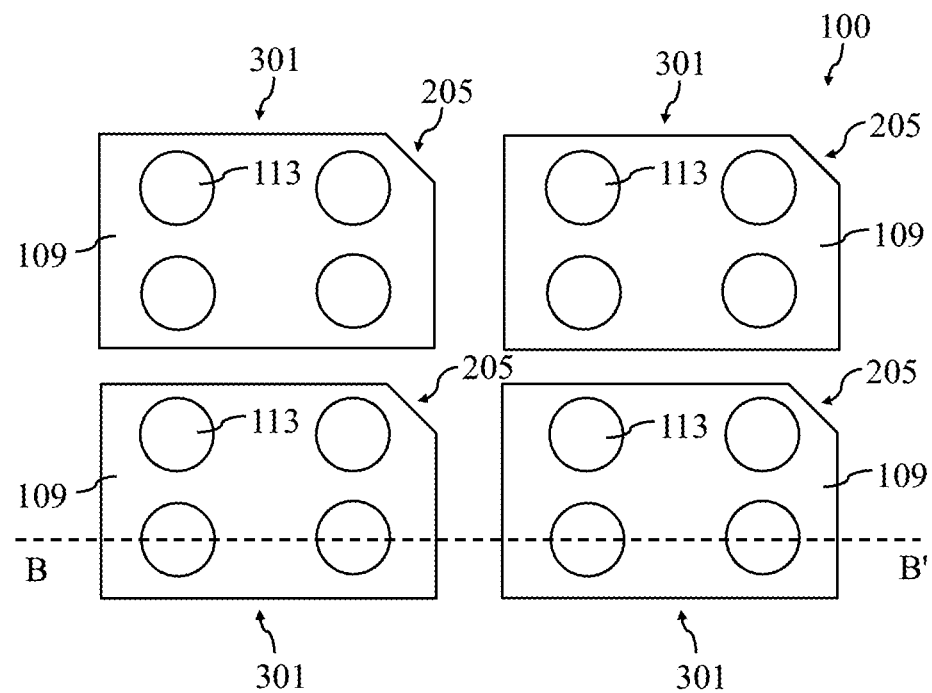
Figure 3B:
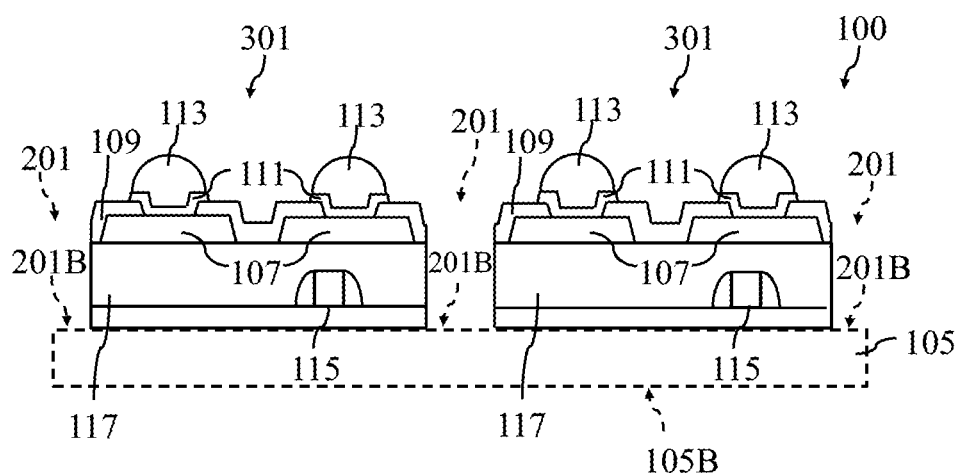

Referring to FIGS. 3A and 3B, in some embodiments, a back side 105B of the substrate 105 is thinned until the bottoms 201B of the trenches 201 are removed. Such a thinning process singulates the workpiece 100 into individual integrated circuit dies 301 and the alignment marks 205 extend through an entire thickness of the integrated circuit dies 301. In some embodiments, the back side 105B of the substrate 105 may be thinned using, for example, a suitable etching process, a chemical mechanical polishing (CMP) process, a mechanical grinding process, the like, or a combination thereof. Subsequently, each of the integrated circuit dies 301 may be tested to identify known good dies (KGDs) for further processing. As described below in greater detail, the integrated circuit dies 301 will be used to form integrated circuit packages.

In the illustrated embodiment, each of the integrated circuit dies 301 comprises four contact pads (such as the contact pads 107), four connectors (such as the connectors 113) and a single passivation layer (such as the passivation layer 109). One skilled in the art will recognize that the number of passivation layers, contact pads, and the connectors is provided for illustrative purposes only and is not limiting the scope of the present disclosure. In other embodiments, each of the integrated circuit dies 301 may comprise an appropriate number of passivation layers, contact pads, and the connectors depending on design requirements for the integrated circuit dies 301.

Figure 4:
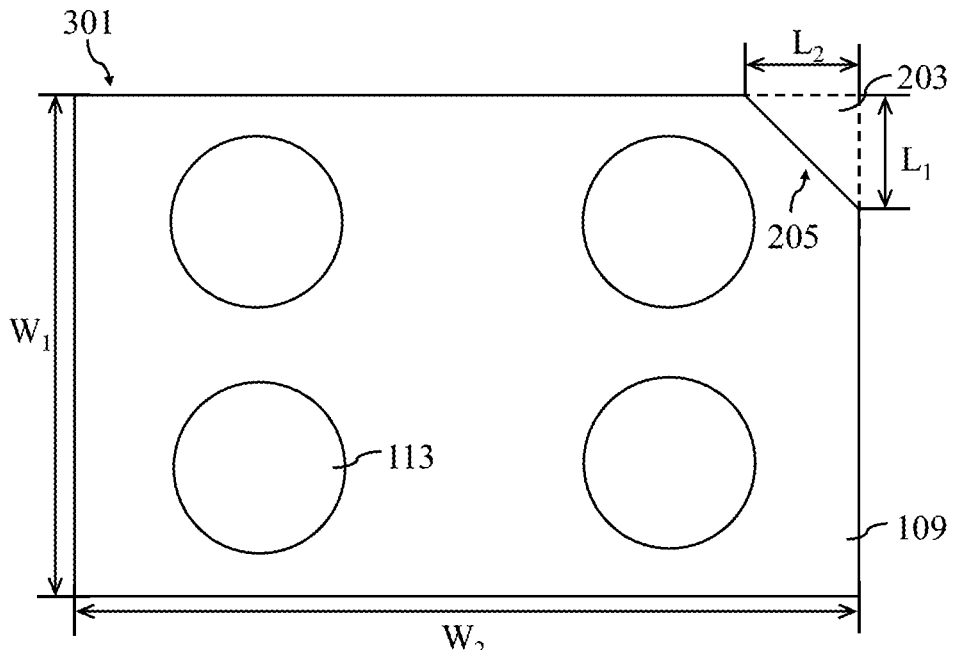
FIG. 4 is a top view of an integrated circuit die in accordance with some embodiments.

FIG. 4 is a top view of one of the integrated circuit dies 301 in accordance with various embodiments. In some embodiments, a first side of the integrated circuit die 301 may have a first width $W_1$ between about 500 μm and about 10000 μm, and a second side of the integrated circuit die 301 may have a second width $W_2$ between about 500 μm and about 10000 μm. In some embodiments, a first side of the triangular portion 203 (parallel to the first side of the integrated circuit die 301) may have a first length $L_1$ between about $W_1/10$ and about $W_1/2$, and a second side of the triangular portion 203 (parallel to the second side of the integrated circuit die 301) may have a second length $L_2$ between about $W_2/10$ and about $W_2/2$.

Figure 5:
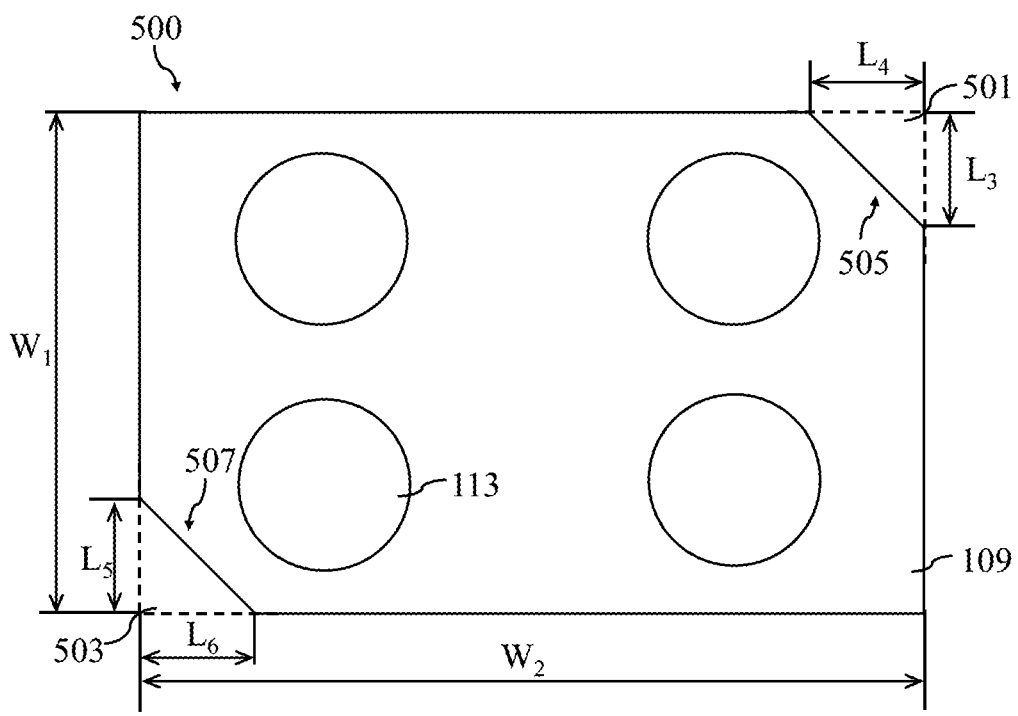
FIG. 5 is a top view of an integrated circuit die in accordance with some embodiments.

FIG. 5 is a top view of an integrated circuit die 500 in accordance with some embodiments. In some embodiments, the integrated circuit die 500 may be formed using similar materials and methods as the integrated circuit dies 301 described above with reference to FIGS. 1A-3B, with similar elements labeled with similar numerical references, and the description is not repeated herein. In some embodiments, during the patterning process described above with reference to FIGS. 2A and 2B, a first triangular portion 501 and a second triangular portion 503 (as viewed from top) are removed from a first corner and a second corner (opposite of the first corner), respectively, of the integrated circuit die 500 to form a first alignment mark 505 and a second alignment mark 507. In some embodiments, a size of the first triangular portion 501 may equal to a size of the second triangular portion 503. In other embodiments, the first triangular portion 501 and the second triangular portion 503 may have different dimensions. In some embodiments, a first side of the integrated circuit die 500 may have a first width $W_1$ between about 500 μm and about 10000 μm, and a second side of the integrated circuit die 500 may have a second width $W_2$ between about 500 μm and about 10000 μm. In some embodiments, a first side of the first triangular portion 501 (parallel to the first side of the integrated circuit die 500) may have a first length $L_3$ between about $W_1/10$ and about $W_1/2$, and a second side of the first triangular portion 501 (parallel to the second side of the integrated circuit die 500) may have a second length $L_4$ between about $W_2/10$ and about $W_2/2$. In some embodiments, a first side of the second triangular portion 503 (parallel to the first side of the integrated circuit die 500) may have a first length $L_5$ between about $W_1/10$ and about $W_1/2$, and a second side of the second triangular portion 503 (parallel to the second side of the integrated circuit die 500) may have a second length $L_6$ between about $W_2/10$ and about $W_2/2$.

Figure 6:
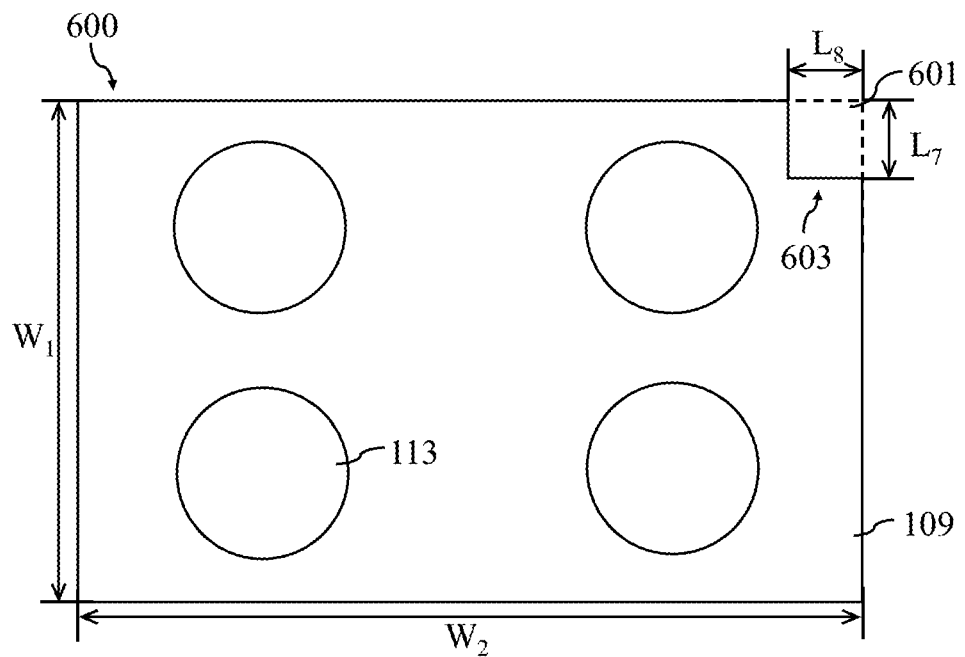
FIG. 6 is a top view of an integrated circuit die in accordance with some embodiments.

FIG. 6 is a top view of an integrated circuit die 600 in accordance with some embodiments. In some embodiments, the integrated circuit die 600 may be formed using similar materials and methods as the integrated circuit dies 301 described above with reference to FIGS. 1A-3B, with similar elements labeled with similar numerical references, and the description is not repeated herein. In some embodiments, during the patterning process described above with reference to FIGS. 2A and 2B, a rectangular portion 601 (as viewed from top) is removed from a corner of the integrated circuit die 600 to form an alignment mark 603. In some embodiments, a first side of the integrated circuit die 600 may have a first width $W_1$ between about 500 μm and about 10000 μm, and a second side of the integrated circuit die 600 may have a second width $W_2$ between about 500 μm and about 10000 μm. In some embodiments, a first side of the rectangular portion 601 (parallel to the first side of the integrated circuit die 600) may have a first length $L_7$ between about $W_1/10$ and about 9 $W_1/10$, and a second side of the rectangular portion 601 (parallel to the second side of the integrated circuit die 600) may have a second length $L_8$ between about $W_2/10$ and about 9 $W_2/10$.

Figure 7:
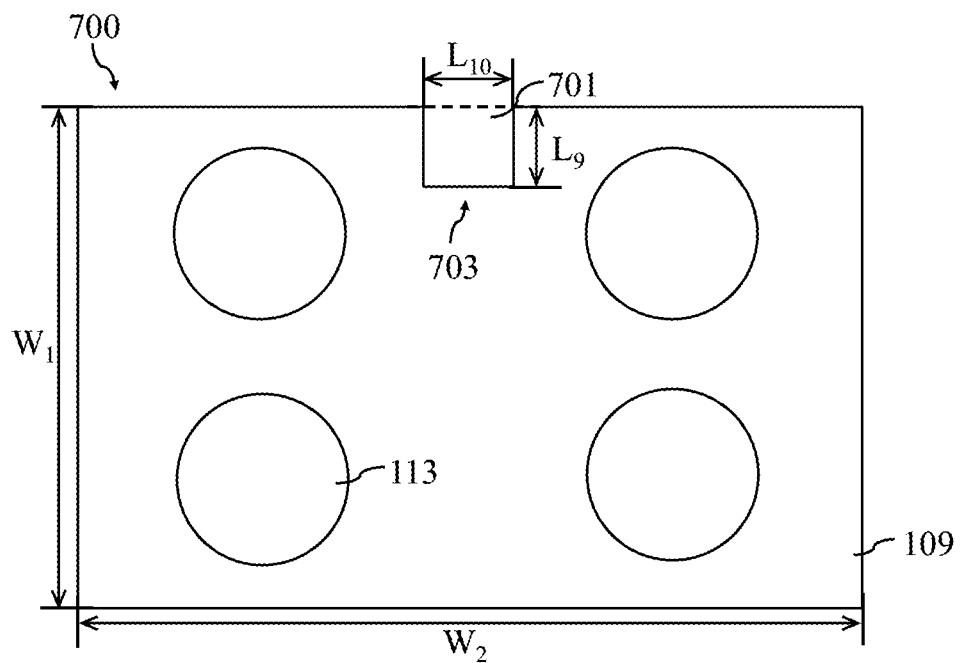
FIG. 7 is a top view of an integrated circuit die in accordance with some embodiments.

FIG. 7 is a top view of an integrated circuit die 700 in accordance with some embodiments. In some embodiments, the integrated circuit die 700 may be formed using similar materials and methods as the integrated circuit dies 301 described above with reference to FIGS. 1A-3B, with similar elements labeled with similar numerical references, and the description is not repeated herein. In some embodiments, during the patterning process described above with reference to FIGS. 2A and 2B, a rectangular portion 701 (as viewed from top) is removed from a sidewall of the integrated circuit die 700 to form an alignment mark 703. In some embodiments, a first side of the integrated circuit die 700 may have a first width $W_1$ between about 500 μm and about 10000 μm, and a second side of the integrated circuit die 700 may have a second width $W_2$ between about 500 μm and about 10000 μm. In some embodiments, a first side of the rectangular portion 701 (parallel to the first side of the integrated circuit die 700) may have a first length $L_9$ between about $W_1/10$ and about $W_1/2$, and a second side of the rectangular portion 701 (parallel to the second side of the integrated circuit die 700) may have a second length $L_{10}$ between about $W_2/10$ and about $W_2/2$.

Referring further to FIGS. 4-7, in the illustrated embodiments, triangular or rectangular portions are removed from the die regions 101 to form alignment marks for the integrated circuit dies 301, 500, 600, and 700. In other embodiments, circular, oval, or polygonal portions may be removed from the die regions 101 to form alignment marks depending on design requirements for integrated circuit dies.

Figure 8:
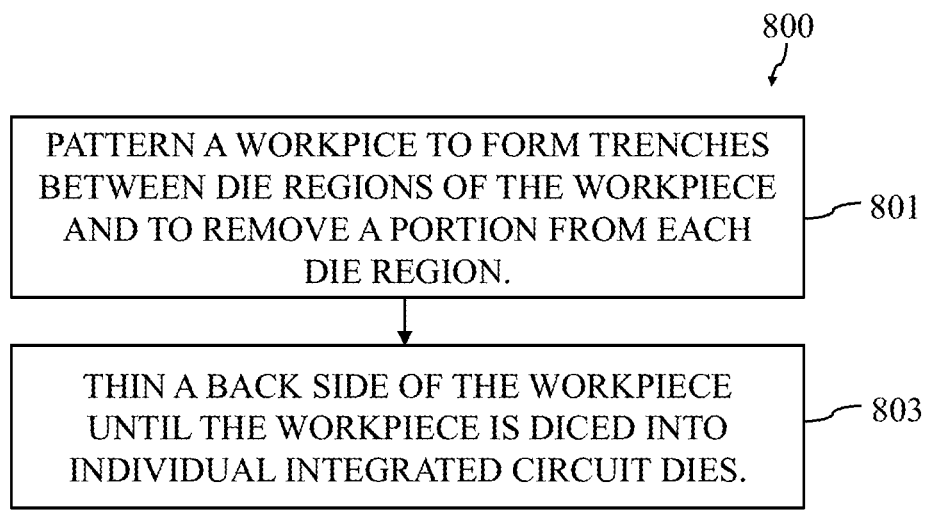
FIG. 8 is a flow diagram illustrating a method of forming integrated circuit dies having one or more alignment marks in accordance with some embodiments.

FIG. 8 is a flow diagram illustrating a method 800 of forming integrated circuit dies having one or more alignment marks in accordance with some embodiments. The method starts with step 801, wherein a workpiece (such as the workpiece 100) is patterned to form trenches (such as the trenches 201) between die regions (such as the die regions 101) of the workpiece and to remove a portion (such as the triangular portion 203) from each die region as described above with reference to FIGS. 2A and 2B. In step 803, a back side of the workpiece is thinned until the workpiece is diced into individual integrated circuit dies (such as the integrated circuit dies 301) as described above with reference to FIGS. 3A and 3B.

FIGS. 9-13 are cross-sectional views of various processing steps during fabrication of integrated circuit packages in accordance with some embodiments. As described below in greater detail, the integrated circuit dies (such as, for example, the integrated circuit dies 301, 500, 600, 700 illustrated in FIGS. 4-7, respectively) will be used to form integrated circuit package (such as the integrated circuit package 1215 illustrated in FIG. 13).

Figure 9:
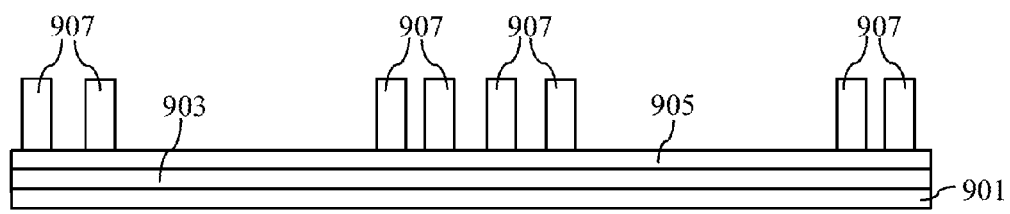
FIGS. 9-13 are cross-sectional views of various processing steps during fabrication of integrated circuit packages in accordance with some embodiments.

Referring first to FIG. 9, in some embodiments, a release layer 903 is formed over a carrier 901, and one or more dielectric layers 905 are formed over the release layer 903 to start forming integrated circuit packages. In some embodiments, the carrier 901 may be formed of quartz, glass, or the like, and provides mechanical support for subsequent operations. In some embodiments, the release layer 903 may comprise a light to heat conversion (LTHC) material, a UV adhesive, or the like, and may be formed using a spin-on coating process, a printing process, a lamination process, or the like. In some embodiments, the release layer 903 formed of a LTHC material partially or fully loses its adhesive strength when exposed to light and the carrier 901 can be easily removed from a back side of a subsequently formed structure. In some embodiments, the one or more dielectric layers 905 may be formed using similar materials and methods as the passivation layer 109 described above with reference to FIGS. 1A and 1B, and the description is not repeated herein.

Referring further to FIG. 9, conductive vias 907 are formed on the one or more dielectric layers 905. In some embodiments, a seed layer (not shown) is formed on the one or more dielectric layers 905. The seed layer may comprise copper, titanium, nickel, gold, the like, or a combination thereof, and may be formed using an electro-chemical plating process, ALD, PVD, sputtering, the like, or a combination thereof. In some embodiments, a sacrificial layer (not shown) is formed over the seed layer. A plurality of openings is formed in the sacrificial layer to expose portions of the seed layer. In some embodiments wherein the sacrificial layer comprises a photoresist material, the sacrificial layer may be patterned using suitable photolithography methods. In some embodiments, the openings of the sacrificial layer are filled with a conductive material such as copper, aluminum, nickel, gold, silver, palladium, the like, or a combination thereof using an electro-chemical plating process, an electroless plating process, ALD, PVD, the like, or a combination thereof to form the conductive vias 907. After the formation of the conductive vias 907 is completed, the sacrificial layer is removed. In some embodiments wherein the sacrificial layer comprises a photoresist material, the sacrificial layer may be removed using, for example, an ashing process followed by a wet clean process. Subsequently, exposed portions of the seed layer are removed using, for example, a suitable etching process.

Figure 10:
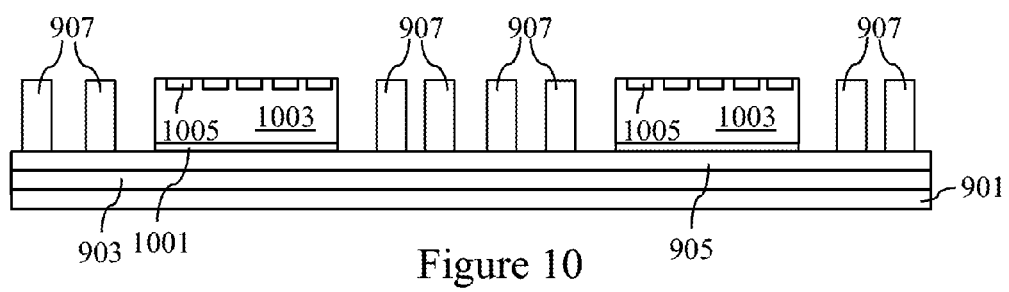

Referring to FIG. 10, integrated circuit dies 1003 are attached to the one or more dielectric layers 905 using adhesive layers 1001. In some embodiments, the integrated circuit dies 1003 are placed on the one or more dielectric layers 905 using, for example, a pick-and-place apparatus. In other embodiments, the integrated circuit dies 1003 may be placed on the one or more dielectric layers 905 manually, or using any other suitable method. In some embodiments, the adhesive layer 1001 may comprise an LTHC material, a UV adhesive, a die attach film, or the like, and may be formed using a spin-on coating process, a printing process, a lamination process, or the like.

In some embodiments, the integrated circuit dies 1003 are mounted to the one or more dielectric layers 905 such that die contacts 1005 are facing away from or distal to the one or more dielectric layers 905. The die contacts 1005 provide an electrical connection to the electrical circuitry formed on the integrated circuit dies 1003. The die contacts 1005 may be formed on active sides of the integrated circuit dies 1003, or may be formed on backsides and comprise through vias. The die contacts 1005 may further comprise through vias providing an electrical connection between first sides and second sides of the integrated circuit dies 1003. In some embodiments, the die contacts 1005 may comprise copper, tungsten, aluminum, silver, gold, tin, a combination thereof, or the like. In some embodiments, the integrated circuit dies 1003 may be formed using methods such as those discussed above with reference to FIGS. 1A-3B and may include one or more alignment marks such as those discussed above with reference to FIGS. 4-7. As discussed above, the use of the one or more alignment marks has various advantages. For example, undesired shifts or rotations of the integrated circuit dies 1003 may be reduced or avoided while mounting the integrated circuit dies 1003 onto the one or more dielectric layers 905. Moreover, damage to the integrated circuit dies 1003 caused by misalignment may be reduced or avoided.

Figure 11:
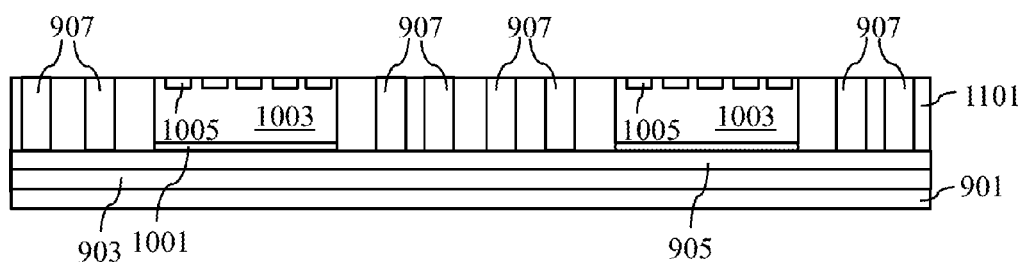

Referring to FIG. 11, an encapsulant 1101 is formed over the carrier 901, and over and surrounding the integrated circuit dies 1003 and the conductive vias 907. In some embodiments, the encapsulant 1101 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the integrated circuit dies 1003 and the conductive vias 907.

Referring further to FIG. 11, in some embodiments, a resulting structure is planarized using a CMP process, a grinding process, the like, or a combination thereof. In some embodiment, the planarization process is performed until the die contacts 1005 of the integrated circuit dies 1003 are exposed. In some embodiments, the top surfaces of the die contacts 1005 are substantially coplanar with top surfaces of the conductive vias 907 and the encapsulant 1101.

Figure 12:
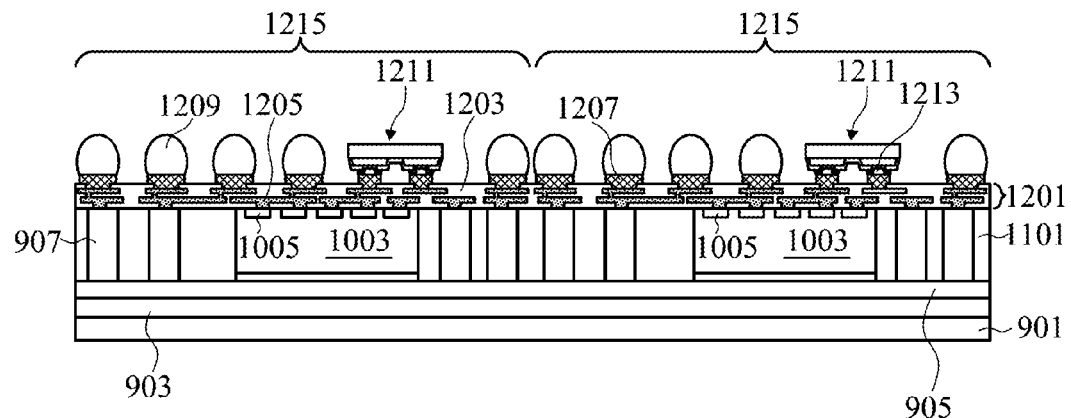

Referring to FIG. 12, one or more redistribution layers (RDLs) 1201 are formed over the integrated circuit dies 1003, the conductive vias 907 and the encapsulant 1101. In some embodiments, the RDLs 1201 comprise one or more dielectric layers 1203 and one or more conductive features 1205 disposed within the one or more dielectric layers 1203. In some embodiments, the one or more dielectric layers 1203 may comprise dielectric materials such as polybenzoxazole (PBO), polyimide (PI), benzocyclobutene (BCB), or the like, and may be formed using a spin-on coating process, or the like. In some embodiments, the one or more conductive features 1205 may comprise copper, tungsten, aluminum, silver, gold, the like, or a combination thereof, may be formed using an electro-chemical plating process, an electroless plating process, ALD, PVD, the like, or a combination thereof.

Referring further to FIG. 12, underbump metallizations (UBMs) 1207 are formed over and electrically coupled to the RDLs 1201. In some embodiments, the UBMs 1207 may be formed using similar materials and methods as the UBMs 111 described above with reference to FIGS. 1A and 1B, and the description is not repeated herein. In some embodiments, connectors 1209 are formed over and electrically coupled to some of the UBMs 1207. In some embodiments, the connectors 1209 may be formed using similar materials and methods as the connectors 113 described above with reference to FIGS. 1A and 1B, and the description is not repeated herein.

Integrated circuit dies 1211 are mounted over and electrically coupled to the RDLs 1201. In some embodiments, the integrated circuit dies 1211 may be formed using similar methods as described above with reference to FIGS. 1A-3B and the description is not repeated herein. In some embodiments, the integrated circuit dies 1211 may have one or more alignment marks such as those described above with reference to FIGS. 4-7. In some embodiments, connectors 1213 of the integrated circuit dies 1211 are used to attach the integrated circuit dies 1211 to the UBMs 1207. In some embodiments, the integrated circuit dies 1211 may be placed on the RDLs 1201 using, for example, a pick-and-place apparatus. In some embodiments, the pick-and-place apparatus may use the one or more alignment marks of the integrated circuit dies 1211 to properly align the integrated circuit dies 1211 over the RDLs 1201. By using the alignment marks, undesired shift and rotation of the integrated circuit dies 1211 may be reduced or avoided. Moreover, damage of the integrated circuit dies 1211 due to misalignment may be reduced or avoided. In other embodiments, the integrated circuit dies 1211 may be placed on the RDLs 1201 manually, or using any other suitable method. In the illustrated embodiment, the integrated circuit dies 1211 are discrete semiconductor device chips. However, in other embodiments, the integrated circuit dies 1211 may be any suitable integrated circuit dies providing desired functionality.

In some embodiments, after mounting the integrated circuit dies 1211 over the RDLs 1201, the resulting structure is detached from the carrier 901 and singulated to form individual integrated circuit packages 1215. In some embodiments, the resulting structure may be diced by sawing, a laser ablation method, or the like. Subsequently, each of the integrated circuit packages 1215 may be tested to identify known good packages (KGPs) for further processing.

Figure 13:
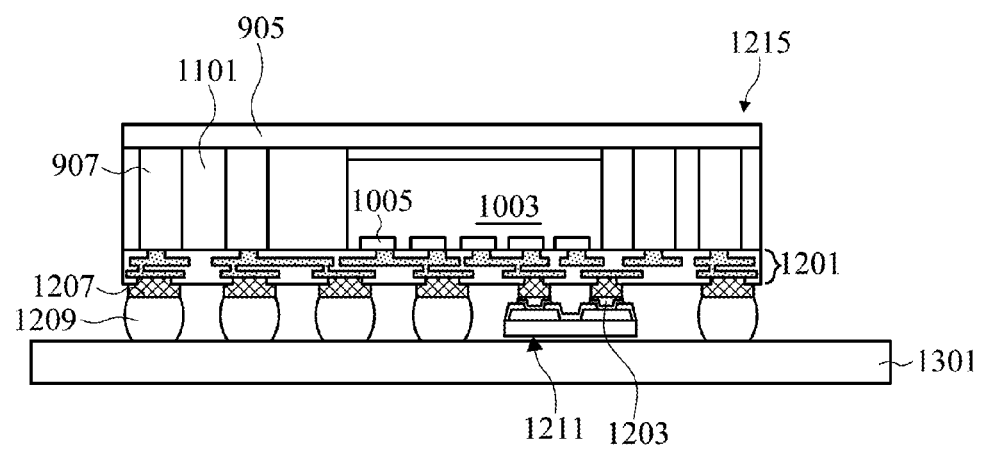

Referring to FIG. 13, in some embodiments, the integrated circuit package 1215 may be bonded to a workpiece 1301 using the connectors 1209 such that the integrated circuit die 1211 is interposed between the RDLs 1201 and the workpiece 1301. In the illustrated embodiment, the workpiece 1301 is a printed circuit board (PCB). However, in other embodiments, the workpiece 1301 may be an integrated circuit package, one or more dies, a package substrate, an interposer, or the like. In some embodiments, an underfill material (not shown) may be injected or otherwise formed in the space between the workpiece 1301 and the integrated circuit package 1215, and surrounding the connectors 1209 and the integrated circuit die 1211. The underfill material may, for example, be a liquid epoxy, deformable gel, silicon rubber, or the like, that is dispensed between the structures, and then cured to harden. The underfill material may be used, among other things, to reduce damage to and to protect the connectors 1209 and the integrated circuit die 1211.

Figure 14:
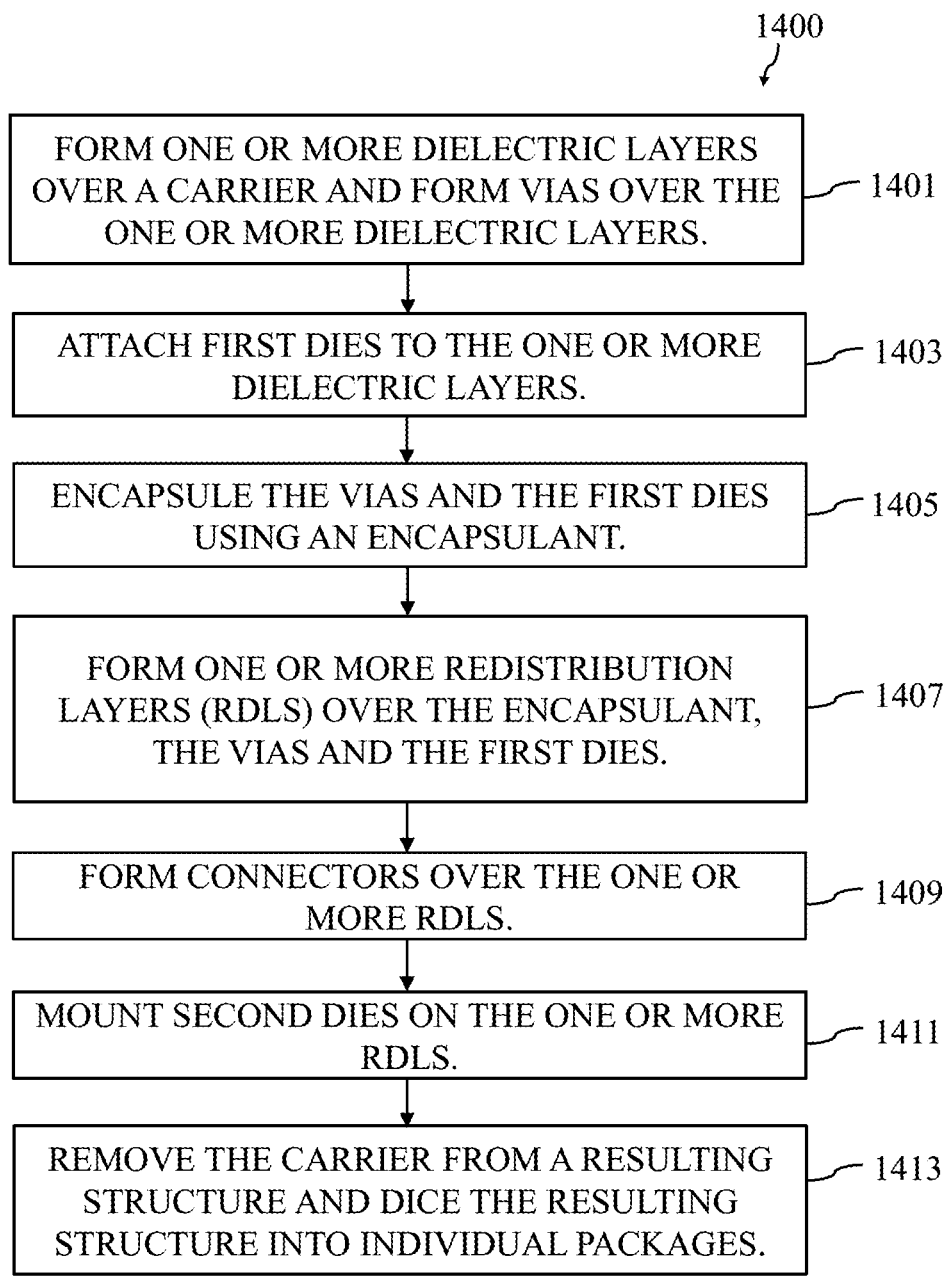
FIG. 14 is a flow diagram illustrating a method of forming integrated circuit packages in accordance with some embodiments.

FIG. 14 is a flow diagram illustrating a method 1400 of forming integrated circuit packages in accordance with some embodiments. The method 1400 starts with step 1401, wherein one or more dielectric layers (such as the one or more dielectric layers 905) are formed over a carrier (such as the carrier 901) as described above with reference to FIG. 9. Subsequently, conductive vias (such as the conductive vias 907) are formed over the one or more dielectric layers as described above with reference to FIG. 9. In step 1403, first integrated circuit dies (such as the integrated circuit dies 1003) are attached to the one or more dielectric layers as described above with reference to FIG. 10. In step 1405, an encapsulant (such as the encapsulant 1101) is formed to encapsulate the conductive vias and the first integrated circuit dies as described above with reference to FIG. 11. In step 1407, one or more redistribution layers (such as the RDLs 1201) are formed over the encapsulated first integrated circuit dies and the conductive vias as described above with reference to FIG. 12. In step 1409, connectors (such as the connectors 1209) are formed over the one or more RDLs as described above with reference to FIG. 12. In step 1411, second integrated circuit dies (such as the integrated circuit dies 1211) are mounted on the one or more RDLs as described above with reference to FIG. 12. In Step 1413, a resulting structure is debonded from the carrier and diced to form individual integrated circuit packages (such as the integrated circuit packages 1215) as described above with reference to FIG. 12.

According to an embodiment, a method includes forming trenches on a first side of a first workpiece, a die of the first workpiece being interposed between neighboring trenches. A portion of the die is removed to form an alignment mark, the alignment mark extending through an entire thickness of the die. A second side of the first workpiece in thinned until the die is singulated, the second side being opposite the first side.

According to another embodiment, a method includes forming a first recess on a first side of a first workpiece, the first recess exposing a side of a die. A second recess is formed on the first side of the first workpiece to form an alignment mark on the die, the first recess and the second recess having a same depth. A second side of the first workpiece is thinned until the die is singulated, the second side being opposite the first side.

According to yet another embodiment, a semiconductor device includes a die. The die includes a substrate, a device on the substrate, and a dielectric layer over the substrate and the device. The semiconductor device further includes an alignment mark on the die, the alignment mark extending completely through the dielectric layer and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming trenches on a first side of a first workpiece, a die of the first workpiece being interposed between neighboring trenches;
   removing a portion of the die to form an alignment mark, the alignment mark extending through an entire thickness of the die; and
   thinning a second side of the first workpiece until the die is singulated, the second side being opposite the first side.

2. The method of claim 1, wherein the die is a discrete semiconductor device chip.

3. The method of claim 1, further comprising:
   aligning, using the alignment mark, the die to a second workpiece; and
   attaching the die to the second workpiece.

4. The method of claim 3, wherein the second workpiece is an integrated circuit package, the die being attached to one or more redistribution lines (RDLs) of the integrated circuit package.

5. The method of claim 1, wherein the trenches and the alignment mark are formed simultaneously.

6. The method of claim 1, wherein removing the portion of the die comprises removing a polygonal portion from a side of the die as viewed from top.

7. The method of claim 1, wherein removing the portion of the die comprises removing a polygonal portion from a corner of the die as viewed from top.

8. A method comprising:
   forming a first recess on a first side of a first workpiece, the first recess exposing a side of a die;
   forming a second recess on the first side of the first workpiece to form an alignment mark on the die, the first recess and the second recess having a same depth; and
   thinning a second side of the first workpiece until the die is singulated, the second side being opposite the first side.

9. The method of claim 8, wherein the die is a discrete semiconductor device chip.

10. The method of claim 8, further comprising:
    aligning, using the alignment mark, the die to a second workpiece;
    attaching the die to the second workpiece; and
    dicing the second workpiece into individual devices.

11. The method of claim 10, wherein the second workpiece comprises a plurality of encapsulated chips and one or more redistribution lines (RDLs) over the plurality of encapsulated chips, the die being attached to the one or more RDLs, the one or more RDLs being interposed between the die and the plurality of encapsulated chips.

12. The method of claim 8, wherein the first recess and the second recess are formed simultaneously.

13. The method of claim 8, wherein forming the second recess removes a polygonal portion from the side of the die as viewed from top.

14. The method of claim 8, wherein forming the second recess removes a polygonal portion from a corner of the die as viewed from top.

15. A method comprising:
    etching a first side of a first workpiece to form a plurality of trenches, the first workpiece comprising a plurality of dies, the plurality of trenches partially separating the plurality of dies from each other, the plurality of trenches having bottoms within a substrate of the first workpiece;
    etching the first side of the first workpiece to form plurality of recesses, each of the plurality of recesses extending from an upper surface of a respective die into the substrate and forming an alignment mark of the respective die, the bottoms of the plurality of trenches being substantially level with bottoms of the plurality of recesses; and
    recessing a second side of the first workpiece until the plurality of dies are fully separated, the second side being opposite the first side.

16. The method of claim 15, wherein recessing the second side of the first workpiece comprises removing a portion of the substrate below the bottoms of the plurality of trenches and below the bottoms of the plurality of recesses.

17. The method of claim 15, wherein the plurality of trenches and the plurality of recesses are formed using a same etching process.

18. The method of claim 15, further comprising:
    aligning the plurality of dies to one or more RDLs of second workpiece using respective alignment marks; and
    attaching the plurality of dies to the one or more RDLs.

19. The method of claim 18, further comprising attaching a plurality of connectors to the one or more RDLs, the plurality of connectors and the plurality of dies being attached on a same side of the one or more RDLs.

20. The method of claim 15, wherein the plurality of dies are discrete semiconductor device chips.

* * * * *